(12) United States Patent
Oberhuber et al.

(10) Patent No.: US 7,796,060 B2
(45) Date of Patent: Sep. 14, 2010

(54) CIRCUITS AND METHODS TO MINIMIZE NONLINEARITY ERRORS IN INTERPOLATING CIRCUITS

(75) Inventors: Ralph G. Oberhuber, Plano, TX (US); Timothy V. Kalthoff, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 40 days.

(21) Appl. No.: 12/188,014

(22) Filed: Aug. 7, 2008

(65) Prior Publication Data

US 2010/0033356 A1 Feb. 11, 2010

(51) Int. Cl.
*H03M 13/00* (2006.01)
(52) U.S. Cl. .................................. 341/94; 341/118
(58) Field of Classification Search ................. 341/144, 341/145, 153, 154, 118, 120, 94
See application file for complete search history.

(56) References Cited

U.S. PATENT DOCUMENTS 5,396,245 A * 3/1995 Rempfer .................... 341/145
6,246,351 B1 6/2001 Yilmaz
6,252,534 B1 * 6/2001 Timko ....................... 341/154
6,448,917 B1 * 9/2002 Leung et al. ................. 341/144
7,283,082 B1 * 10/2007 Kuyel et al. ................. 341/155
7,576,674 B2 * 8/2009 Tsuchi ....................... 341/144

* cited by examiner

*Primary Examiner*—Peguy JeanPierre
(74) *Attorney, Agent, or Firm*—John J. Patti; Wade J. Brady, III; Frederick J. Telecky, Jr.

(57) ABSTRACT

Circuits and methods to minimize nonlinearity errors in interpolating circuits are described herein. A disclosed example circuit comprises first and second voltage-current converter circuits, each including a first transistor and a second transistor, each having a first electrode configured to receive a signal generated by a corresponding current source, a first current source providing a signal to the first voltage-converter circuit and comprising a first error correction circuit to minimize integral nonlinearity error in the interpolation circuit by setting a first current through the first current source to operate the first voltage-converter circuit in a nominal linear operating mode, and a second current source providing a signal to the second voltage-converter circuit and comprising a second error correction circuit to minimize integral nonlinearity error in the interpolation circuit by setting a second current through the second current source to operate the second voltage-converter circuit in the nominal linear operating mode.

26 Claims, 5 Drawing Sheets

US 7,796,060 B2

CIRCUITS AND METHODS TO MINIMIZE NONLINEARITY ERRORS IN INTERPOLATING CIRCUITS

FIELD OF THE DISCLOSURE

This disclosure relates generally to interpolating amplifiers, and, more particularly, to methods and circuits to minimize linearity errors in interpolating circuits.

BACKGROUND

There are many types of digital-to-analog controllers (DACs), which convert digital signals (i.e., a representation of a signal using discrete numbers) into continuous time signals (i.e., an analog signal). Currently, many high-resolution DACs implement a multistage dual string DAC topology using two sets of resistor strings to construct an output voltage from a digital signal, with the first string DAC implementing the most significant bits (MSBs) of the digital signal and the second string DAC implementing the least significant bits (LSBs) of the digital signal. The two voltages from the DAC strings are summed together to generate the analog signal. A string DAC is a type of static DAC including a plurality of resistors connected in series between a high reference voltage and a low reference voltage, where the various connecting nodes between the resistors constitute tap points that are selectively switched to an output node in response to the digital input, and the voltage of the tap point selectively switched to the output node is an inherently monotonic analog representation of the digital input.

Another type of multistage DAC is an interpolating DAC including a string DAC and a LSB segmented interpolation DAC. The interpolating DAC uses an interpolation circuit to interpolate between two voltages provided by the string DAC. The string DAC provides a portion of the analog signal corresponding to the MSB of a digital signal, while the interpolation DAC provides the portion of the analog signal corresponding to the LSB of the digital signal. Additionally, the interpolation DAC and the string DAC are inherently monotonic to ensure that the entire DAC is monotonic. The string DAC allows for larger coarse voltages for the MSB of a digital signal, while the interpolation DAC uses differential pairs of transistors to accurately interpolate between the two voltages from the string DAC. The interpolating DAC design increases the effective resolution and accuracy of a DAC while minimizing the number of components and energy consumption. As computing, sensing, motor control, process control and feedback control system require greater precision, the accuracy of a DAC becomes more important because sources of error in DACs limit the resolution accuracy. Currently, for 12-16 bit DACs, which implement LSB interpolating circuits, error is on the order of 1-3 bits, thereby limiting the precision of applications.

BRIEF SUMMARY OF THE INVENTION

Example circuit and methods to minimize nonlinearity errors in an interpolating circuit are described. An example circuit includes first and second voltage-current converter circuits. Each of the voltage-current converter circuit includes a first transistor and a second transistor, with each of the first transistor and the second transistor having a first electrode configured to receive a signal generated by a corresponding current source. Additionally, the example circuit includes a first current source providing a signal to the first voltage-converter circuit and comprising a first error correction circuit to minimize a first integral nonlinearity error in the interpolation circuit by setting a first current through the first current source to operate the first voltage-converter circuit in a nominal linear operating mode. Furthermore, the example circuit includes a second current source providing a signal to the second voltage-converter circuit and comprising a second error correction circuit to minimize a second integral nonlinearity error in the interpolation circuit by setting a second current through the second current source to operate the second voltage-converter circuit in the nominal linear operating mode.

Nonlinearity error is generated in an interpolation circuit through the interpolation of a first voltage and a second voltage. For example, when ¾ of differential pairs (i.e., voltage-current converter circuits) in an interpolating circuit are connected to a first voltage and the other ¼ of the differential pairs are connected to a second voltage the interpolation circuit relies on interpolation between the two voltages. The example error correction circuits minimize nonlinearity error by modifying the current in each of the differential pairs to compensate for the differences in gate voltage between the differential pairs connected to the first voltage and differential pairs connected to the second voltage.

DETAILED DESCRIPTION

Figure 1:
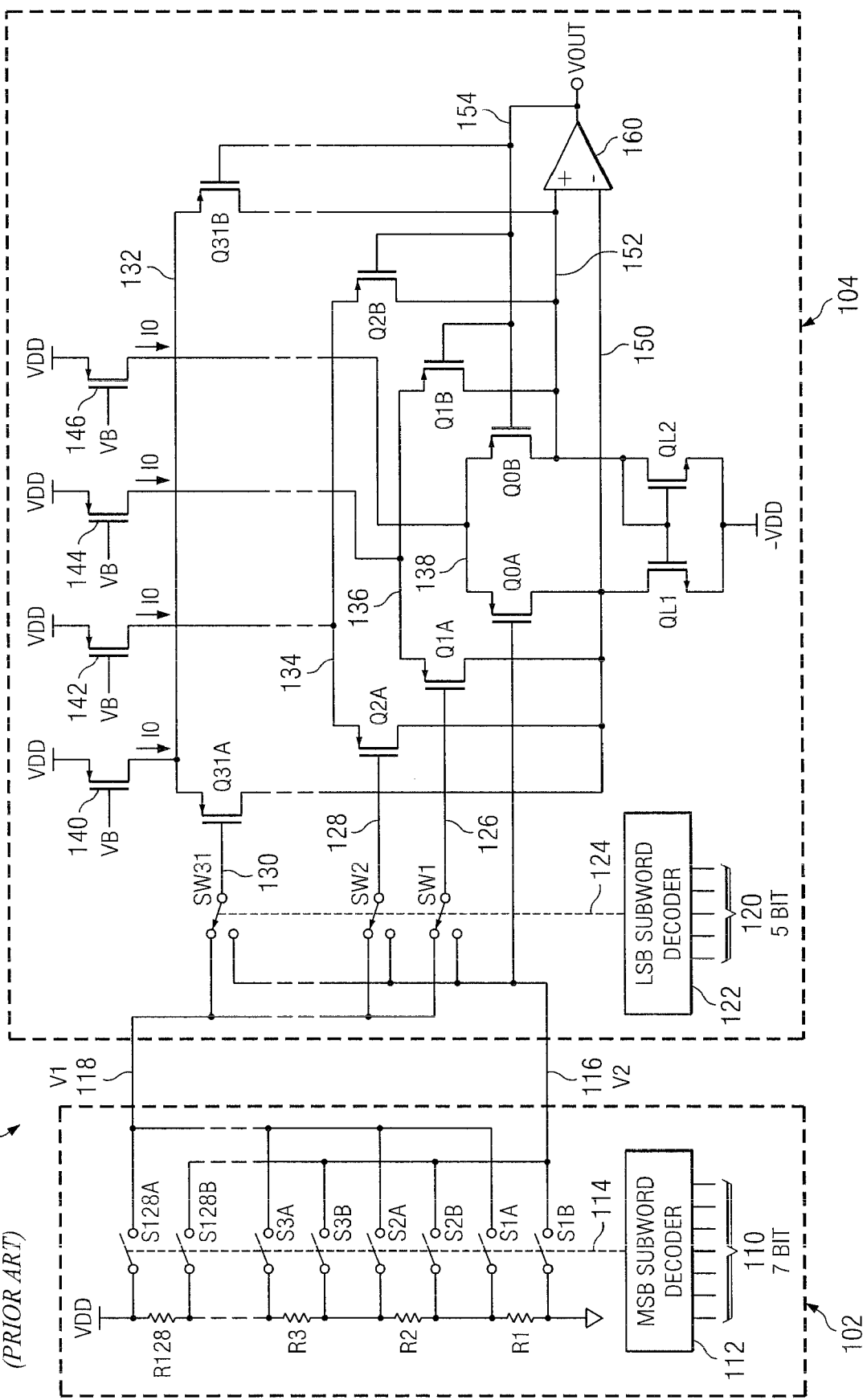
FIG. 1 shows a prior art schematic diagram of a multistage DAC including a string DAC and an interpolating DAC.

Interpolating circuits and methods to minimize nonlinearity error in the same are disclosed herein. In some examples, a multistage digital-to-analog controller (DAC) includes an interpolation circuit for digitally interpolating between a first voltage on a first conductor and a second voltage on a second conductor. Additionally, the interpolation circuit comprises a first and a second voltage-converter circuit. The first and the second voltage-converter circuits include a first transistor and a second transistor, each of the first transistor and the second transistor have a first electrode configured to receive a signal generated by a corresponding current source. Furthermore, the interpolating circuit includes a first current source providing a signal to the first voltage-converter circuit and comprising a first error correction circuit to minimize integral nonlinearity error in the interpolation circuit by setting a first current through the current source to operate the corresponding voltage-converter circuit in a nominal linear operating current mode and a second current source providing a signal to the second voltage-converter circuit and comprising a second error correction circuit to minimize an integral nonlinearity error in the interpolation circuit by setting a second current through the current source to operate the corresponding voltage-converter circuit in a nominal linear operating current mode.

The nonlinearity error or integral nonlinearity (INL) error is a measure of how much the output signal generated by a multistage DAC differs from theoretical calculated operation. Due to the monotonic nature of a string DAC and an interpolating DAC, the analog output should be a linear representation of the digital input. In other words, for every bit increase in the digital signal the analog voltage should increase by the same voltage. The deviation from this theoretical linear voltage yields an output analog signal that is sometimes greater in magnitude then the theoretical value or less then the theoretical value. For example, if in a theoretical multistage DAC a digital input corresponding to a theoretical analog output voltage is 440 millivolts (mV), but the measured analog output voltage is 439.6 mV, then the difference in the theoretical value from the actual value is the INL error (i.e., 0.4 mV).

INL error is generated in an interpolation circuit through the interpolation of a first voltage and a second voltage. For example, when all of the differential pairs of transistors (i.e., voltage-current converter circuits) of an interpolation circuit are connected to the first voltage or the second voltage, there is no interpolation and no INL error in the output analog signal. When half of the differential pairs are connected to the first voltage and the other half of the differential pairs are connected to the second voltage the interpolation takes an average of the interpolation voltages and any INL errors cancel out. However, when ¾ of the differential pairs are connected to the first voltage and the other ¼ of the differential pairs are connected to the second voltage the interpolation circuit relies on interpolation between the two voltages. At this point there is not enough of a balance to cancel the INL error and too great a difference in number of differential pairs switched to each voltage to rely strictly on one interpolation point. The error correction circuits minimize INL error by modifying the current through the differential pairs to compensate for the differences in gate voltage between the differential pairs connected to the first voltage and differential pairs connected to the second voltage.

Examples of error correction circuits include any current modifying components and/or modifications to components within each segment of a current source of an interpolating circuit such as, for example, a degenerative resistor in series with a current source transistor, a current source transistor with modified dimensions, a voltage-current converter differential pair transistor with modified dimensions, and/or a degenerative resistor in series with a current reference and a gate of a current source transistor. The current modifying components and/or modifications to components are calculated such that the modified value and/or current modifying component value minimizes the nonlinearity error in a multistage DAC with an interpolating circuit without causing a degradation in performance and/or functionality in the same multistage DAC. The calculations and resulting modifications are preformed on each voltage-current converter circuit within the interpolating circuit to reduce the contributing nonlinearity error from each voltage-current converter circuit. Although the example methods and apparatus described herein generally relate to multistage DACs with interpolating circuits, the disclosure is not limited to such. On the contrary, the teachings of this disclosure may be applied in any electronics device that would benefit from DACs.

The purpose of an interpolating circuit within a multistage DAC is to increase the resolution or the size of bit decoding by a DAC without exponentially increasing the number of components and/or the power consumption of those components.

For example, a single stage 16 bit resistor string DAC or a single stage 16 bit interpolating DAC requires $2^{16}$ components (i.e. 65536 components), while the same resolution is achieved with a multistage combination of the two DACs such as, for example, a 9 bit string DAC with 512 resistors and a 7 bit segmented interpolating DAC with 128 differential pairs of transistors. Multistage DACs are used in a wide variety of applications that require a digital signal converted into a precise analog voltage, including micro-electrical mechanical device actuation, micro motor control, generation of audio signals, generation of RF signals, feed-back control operations, etc. DACs are used in mixed signal integrated circuits for signal processing, test and measurement, medical and scientific instrumentation, medical imaging, personal computing, and/or multimedia applications.

FIG. 1 shows a prior art multistage DAC 100 including a resistive string DAC 102 and an interpolating DAC 104. The prior art example multistage DAC 100 is configured to receive a 12 bit digital input with the 7 MSBs allocated for a MSB subword decoder 112 and the 5 LSBs allocated for a LSB subword decoder 122. The MSBs of a digital input are decoded using the resistive string DAC 102 which includes resistors R1-R128 in series between a reference ground conductor and a reference voltage VDD. VDD may, for example, be a voltage generated by a power supply. Additionally, the resistors R1-R128 are all equal resistance. The number of resistors in series is dependent upon the number of digital bits designed to be decoded. N digital bits generally require a resistive string of $2^N$ resistors which includes one resistor for each bit of the DAC connected to a conductor. The voltage output from the string DAC 102 is monotonic such that the series resistors have a voltage drop corresponding to each digital bit input.

An upper terminal of each resistor R1-R128 is connected by a respective upper switch S1A-S128A to a first conductor 118 and a lower terminal of each resistor R1-R128 is connected by a respective lower switch S1B-S128B to a second conductor 116. The upper switch and lower switch connected to each resistor is a switch pair. For example, switch S2A and switch S2B are a switch pair for resistor R2. The switch pairs S1A-S1B through S128A-S128B are controlled by the MSB subword decoder 112. The MSB subword decoder 112 selects a switch pair via a switch selector 114 based on a received digital input 110. The MSB subword decoder 112 selects one switch pair per digital input 110. Because the resistors R1-R128 have the same resistance, the voltage drop across each resistor R1-R128 is the same.

The voltage across any particular string resistor selected by the MSB subword decoder 112 is linearly interpolated by the interpolation DAC 104 according to the value of the LSB subword. For M-bit resolution, an interpolating DAC requires $2^M$ differential pairs of transistors. The interpolation DAC 104 includes differential pairs of transistors Q0A-Q0B through Q31A-Q31B, current sources 140-146 for the differential pairs, dynamic load transistors QL1 and QL2, switches SW1-SW31, and an output amplifier 160. For simplicity, only current sources 140-146 are shown for the respective differential pairs, however, there are current sources for the differential pairs of transistors not shown in FIG. 1. Each differential pair of transistors (e.g., Q2A-Q2B) and the corresponding current source (e.g., current source 142) comprise an interpolating segment.

The interpolating DAC 104 uses differential configuration with a pair of transistors, with each differential pair having its own respective current courses to reduce the voltage change by ½ of the net voltage change that occurs on the gates of the differential pairs on the conductor connecting each differential transistor pair. In the example of the multistage DAC 100 of FIG. 1, voltage-current converter circuits are implemented using differential pairs of P-type metal oxide semiconductor (PMOS) transistors. A differential pair functions by receiving a current from a current source and a gate voltage on one of the transistors in the differential pair (e.g., Q0A-Q31A). The gate voltage sets the transistor into an operational mode, in this case a weak inversion linear operating mode (normal operation in the weak inversion state depends on the dimensions of the transistors and the selected value of bias current, but is true in most modern circuits). The differential pair of transistors functions such that the voltage applied to the gate of one transistor is mirrored on the gate of the other transistor (e.g., Q0B-Q31B) in the differential pair. This enables the interpolating DAC 104 to average two different voltages from a first set of differential pairs with gate voltages equal to the voltage on the first conductor 116 and a second set of differential pairs with gate voltages equal to the voltage on the second conductor 118.

The interpolation DAC 104 uses the differential pairs of transistors Q0A-Q0B through Q31A-Q31B to interpolate between the voltage on the first conductor 118 and the second conductor 116. The 32 differential pairs enable the interpolating DAC 104 to interpolate between one of 32 values corresponding to a 5-bit LSB digital input. The resulting interpolation voltage is added to the voltage on the second conductor 116 to thereby generate the monotonic analog output voltage Vout that represents the digital input.

The gates of the PMOS transistors Q1A-Q31A in the differential pairs are coupled to respective conductors 126-130 that are coupled to respective switches SW1-SW31 which receive a voltage from the first conductor 118 or the second conductor 116. The switches SW1-SW31 are controlled by an LSB subword decoder 122. The LSB subword decoder 122 receives a 5-bit digital input 120 and determines which switches SW1-SW31 should be switched to the first conductor 118 and which switches SW1-SW31 should be switched to the second conductor 116. The LSB subword decoder 122 uses a switch selector 124 to switch the switches SW1OSW31 to the desired conductor. The PMOS transistor Q0A is directly connected to the second conductor 116 because the interpolating DAC 104 ranges from digital input '00000' to '11111' meaning there will always be at least one PMOS transistor connected to the second conductor 116.

The differential pair PMOS transistors Q0A-Q0B through Q31A-Q31B include source electrodes connected to current sources 140-146 by respective conductors 132-138. Each differential pair receives current from a respective current source. For example, differential pair transistors Q31A and Q31B receive current from current source 140. Each current source 140-146 includes a PMOS current transistor with a source electrode connected to a voltage source (i.e. VDD) a gate electrode connected to a bias gate voltage (i.e., VB), and a drain connected to a conductor connecting the sources of a differential pair of transistors. The voltage source provides a voltage for the current transistor to generate a drain current to supply to the differential pair and may be generated by a voltage reference circuit, an integrated circuit, a power supply, etc. The bias gate voltage controls the operational state of the current transistor and may be generated by a reference circuit, a control circuit, a voltage generator, a power source, etc. For normal operation of the interpolation DAC 104, the current transistors operate in a weak inversion state. The current sources are connected to the same voltage source (i.e., VDD) and the same bias gate voltage source (i.e., VB). Additionally, the current transistors have the exact same dimensions (if technology variations can be neglected) ensuring the same current lo is supplied to each differential pair of transistors.

The drains of the differential pair transistors Q0A-Q0B through Q31A-Q31B are connected by conductors to load transistors QL1 and QL2. The sources of QL1 and QL2 are connected to the −VDD reference voltage. Additionally, the conductor 150 connects the drain of transistors Q0A-Q31A to the positive terminal of the output amplifier 160 and the conductor 152 connects the drain of transistors Q0B-Q31B to the negative terminal of the output amplifier 160. Furthermore, the gates of the differential transistors Q0B-Q31B are connected to the output conductor 154 and receive the voltage VOUT generated by the output of the output amplifier 160.

Figure 4:
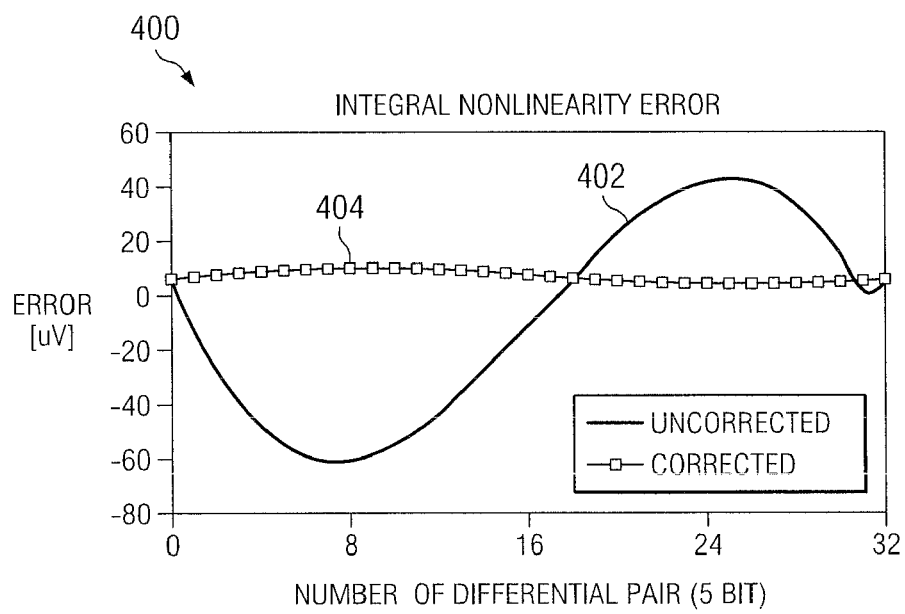
FIG. 4 illustrates example output waveforms of the nonlinearity error calculated from the prior art multistage DAC of FIG. 1 and the example multistage DAC including the error

The output of the interpolation DAC 104 of FIG. 1 includes systematic INL errors resulting from the voltage on the gates on some of the transistors (i.e., Q1A-Q10A) connected to the first conductor 118 and voltage on the gates of the other transistors (i.e., Q0A, Q1A-Q31A) connected to the second conductor 116. The magnitude of the INL errors for the multistage DAC 100 of FIG. 1 is shown in FIG. 4. Currently, nonlinearity errors may be on the magnitude up to 3 bits of resolution effectively decreasing the accuracy of the multistage DAC 100.

Figure 2:
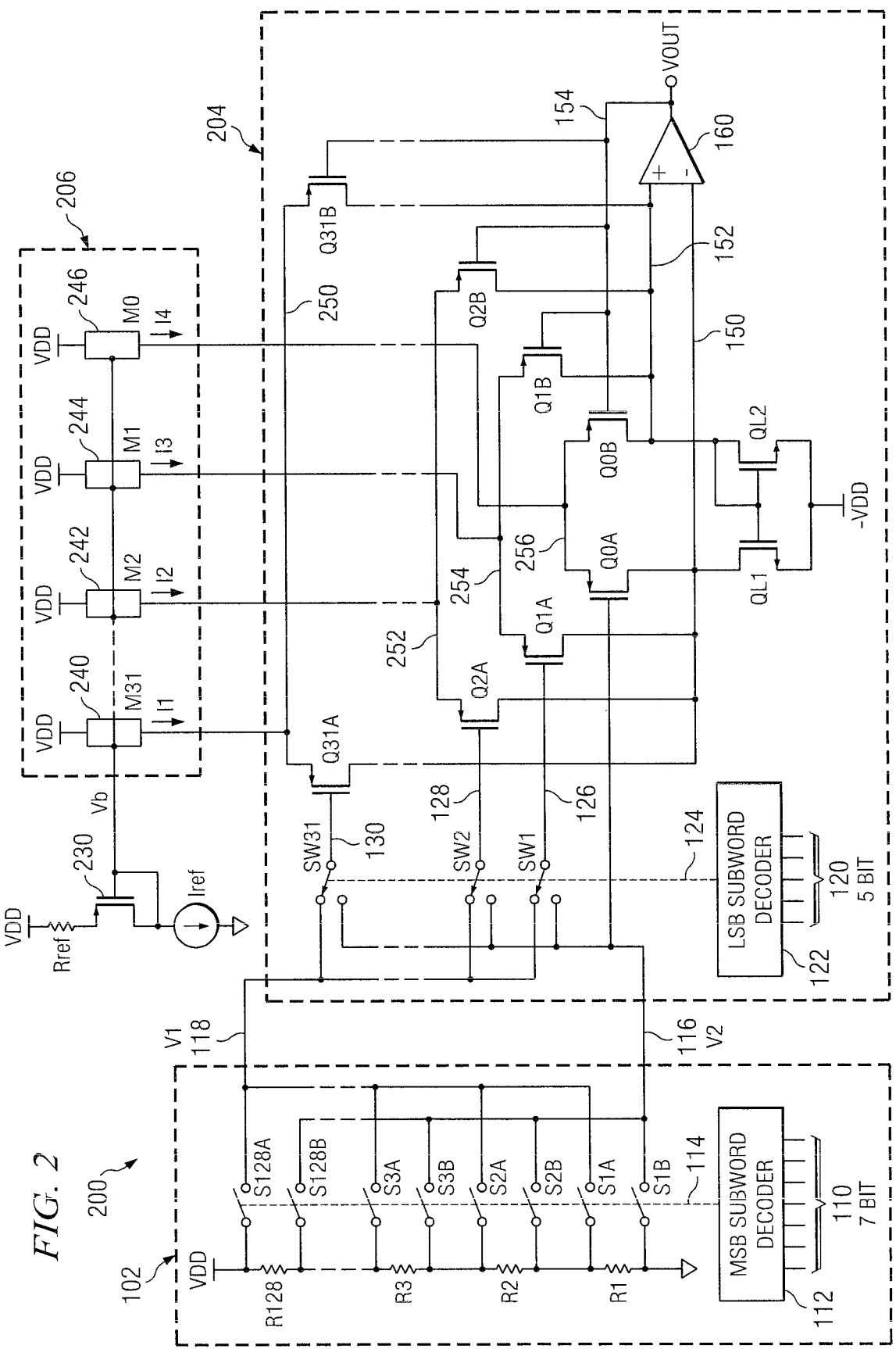
FIG. 2 shows a schematic diagram of a multistage DAC including the string DAC of FIG. 1, an interpolating circuit, and a current correction circuit.

The INL errors are minimized in the example multistage DAC 200 shown in FIG. 2. The example multistage DAC 200 includes the string DAC 102 of FIG. 1 and an interpolating DAC 204 connected to a current correction circuit 206. The current correction circuit 206 includes error correction circuits 240-246 providing respective current $I_1$-$I_4$ to the respective differential pair of transistors. Although only error correction circuits 240-246 are shown in FIG. 2, the current correction circuit 206 includes error correction circuits for the differential pairs of transistors (i.e., Q3A-Q3B through Q30A-Q30B) not shown. Each current circuit block 240-246 includes a current transistor with its source connected to a voltage source VDD. Each differential pair of transistors and the corresponding current correction circuit comprise an interpolating segment. For example differential pair Q2A-Q2B and the current correction circuit comprise interpolating segment 2.

Development of the example interpolating DAC 204 revealed INL errors are generated by voltage differences on the gates of differential pair transistors. For example, the first conductor 118 may include a voltage of 4.080V while the second conductor includes a voltage of 4.040V. The 0.040V difference in gate voltages generates a slightly different drain current in the differential pair of transistors connected to the first conductor 118 compared to the differential transistors connected to the second conductor 116. The slight difference in drain currents between the differential pairs of transistors carries through interpolating DACs without error correction circuits to generate INL errors in the output analog voltage from the output amplifier. The accuracy is further reduced for multistage DACs when fewer bits are allocated for the string DAC. For example, if the number of bits is reduced in the string resistor, the number of string resistors is reduced which increases the voltage drop across each resistor. This increases the voltage difference between the first conductor 118 and the second conductor 116 received by the gates of the differential pairs which increases the INL error of the multistage DAC. The example interpolating DAC 204 including the error correction circuits 240-246 minimize INL error in multistage DACs by compensating for the current difference between differential pairs regardless of the number of string resistors, interpolating voltages, differential pairs, design technology, etc.

The operative states of the error correction circuits 240-246 are controlled by a bias voltage generated by a reference circuit 230. This reference circuit 230 functions as a current mirror such that the current generated by the error correction circuits 240-246 has a similar magnitude current as the current generated by the Iref current source. Additionally, the error correction circuits 240-246 include components and/or modifications to the dimensions of the current transistors with the error correction circuits 240-246 to minimize INL errors. As a result, the modified current provided by each current circuit block 240-246 is different (i.e., I1-I4), thus providing each differential pair of transistors with a modified current to compensate for the INL error due to dissimilar gate voltages. The reference circuit 230 also includes a reference resistor Rref to resistively degenerate the reference circuit 230 to enable current modifying in the error correction circuits 240-246. The components and/or circuit modifications within the error correction circuits 240-246 are described in further detail in FIGS. 3A-3F.

Examples of error correction circuits 240-246 within the error correction circuits 240-246 include but are not limited to any current modifying components and/or modifications to components within the error correction circuits 240-246 such as, for example, a degeneration resistor in series with a current source transistor, a current source transistor with modified dimensions, and/or a degenerative resistor in series with a current reference and a gate of a current source transistor. Additional or alternatively, the physical dimensions of the PMOS transistors Q0A-Q0B through Q31A-Q31B may be modified to adjust current through the differential pair to minimize INL error.

The values of the modifying components within the error correction circuits 240-246 are calculated from plotting the INL error over a span of all possible digital inputs (from '00000' to '11111' for the 5-bit interpolating DAC 204) for the interpolating DAC 204 without the error correction circuits 240-246. Once the INL error is determined, the correction value for the INL error for each differential pair of transistors is derived. For example, the INL error is −50 microvolts (uV) in the case of 6 differential pairs of transistors switched to the first conductor 118 and 26 differential pairs of transistors switched to the second conductor 116. Additionally, the INL error is −60 uV in the case of 7 differential pairs of transistors switched to the first conductor 118 and 25 differential pairs of transistors switched to the second conductor 116. The current correction term for the interpolating segment 7 is determined from the INL error when the 7 differential pairs are connected to the first conductor 118 subtracted from the INL error when the 6 differential pair are connected to the first conductor 116 (i.e., −60 uV subtracted from −50 uV). This difference is multiplied by a constant value and added to the value of the corresponding component in the reference circuit 230. In other words, the INL error correction circuits are derived from calculating the derivative of the INL error for the interpolating DAC 104 without current correction circuits.

In an example of calculating the value of a degeneration resistor in an error correction circuit in the interpolating segment 7, the value of the resistor is calculated by taking the INL error difference between the INL error of interpolating segment 7 and interpolating segment 6 (i.e., −10 uV). The difference is then multiplied by a correlation constant (i.e., 0.3 kOhm/uV) to convert the INL error from a voltage to a resistance. The calculated resistance delta value is added to the resistance value of the Rref resistor resulting in the value of the degeneration resistor for the error correction circuit corresponding to interpolating segment 7. The correlation constant is calculated for each multistage DAC 200 and is dependent upon the number of differential pairs, the number of string resistors, the process technology used to fabricate the multistage DAC 200, and the design scheme to implement the multistage DAC 200. The calculation method is based on the fact switches SW1-SW31 are switched to the first conductor 118 by their numerical order. For example, SW1 is switched to the first conductor for digital inputs of '00001' and greater, SW2 is switched to the first conductor for digital inputs of '00010' and greater, etc.

The interpolating DAC 204 uses differential configuration with a pair of transistors, with each differential pair having its own respective current sources to reduce the voltage change by ½ of the net voltage change that occurs on the gates of the differential pairs on the conductor connecting each differential transistor pair. This reduces the current range experienced by each differential pair over the range of LSB digital inputs and enables the each differential pair to operate within its normal operating point providing a linear monotonic output. In the example of the multistage DAC 200 of FIG. 1, voltage-current converter circuits are implemented using differential pairs of PMOS transistors. A differential pair functions by receiving a current from a current source and a gate voltage on one of the transistors in the differential pair (e.g., Q0A-Q31A). The gates of the PMOS transistors Q1A-Q31A in the differential pairs are coupled to respective conductors 126-130 that are coupled to respective switches SW1-SW31 which receive a voltage from the first conductor 118 or the second conductor 116. The gate voltage sets the transistor into an operational mode, in this case a weak inversion linear operating mode. The differential pair of transistors functions such that the voltage applied to the gate of one transistor is mirrored on the gate of the other transistor (e.g., Q0B-Q31B) in the differential pair. This enables the interpolating DAC 204 to average two different voltages from a first set of differential pairs with gate voltages equal to the voltage on the first conductor 116 and a second set of differential pairs with gate voltages equal to the voltage on the second conductor 118.

The interpolation DAC 204 uses the differential pairs of transistors Q0A-Q0B through Q31A-Q31B to interpolate between the voltage on the first conductor 118 and the second conductor 116. The 32 differential pairs enable the interpolating DAC 104 to interpolate between one of 32 values corresponding to a 5-bit LSB digital input. The resulting interpolation voltage is added to the voltage on the second conductor 116 to thereby generate the monotonic analog output voltage Vout that represents the digital input. For example, if the first conductor 118 has a voltage of 4.080V and the second conductor 116 has a voltage of 4.040V, the differential pairs of transistors Q0A-Q0B through Q31A-Q31B enable the interpolating DAC 204 to interpolate between 4.040V and 4.080V in 0.00125V steps. The output of the interpolation DAC 204 can be expressed as a mathematical formula (1):

$$V_{out} = \frac{(M - \alpha) + V_{low} + \alpha V_{high}}{M} \quad (1)$$

Where $V_{out}$ is the output of the interpolation DAC 204 on the output conductor 154 of the output amplifier 160, M is the total number of differential pairs, α is the number of differential pair transistors Q0A-Q31A with a gate connected to the first conductor 118, $V_{low}$ is the voltage on the second conductor 116, and $V_{high}$ is the voltage on the first conductor 118. The mathematical formula (1) shows that $V_{out}$ is a binary weighted voltage based on the number of differential transistors with a gate voltage connected to the first conductor 118 and the number of differential transistors with a gate voltage connected to the second conductor 116.

The mathematical formula (1) shows that the interpolating DAC 204 is monotonic such that the number of PMOS transistors switched to the first conductor 118 increases as the LSB digital input increases in value. For example, a LSB digital input of '10010' results in SW1-SW18 switched to the first conductor 118 with the remaining switches SW19-SW31 switched to the second conductor. Then if the LSB digital input changes to '10011,' SW1-SW19 are switched to the first conductor and SW20-SW31 are switched to the second conductor.

The drains of the differential pair transistors Q0A-Q31A are connected by the conductor 150 to the drain of the n-channel load transistor QL1 and the drain of transistors Q0B-Q31B are connected by the conductor 152 to load transistor QL2. The sources of QL1 and QL2 are connected to the −VDD reference voltage. Additionally, the conductor 150 connects the drain of transistors Q0A-Q31A to the positive terminal of the output amplifier 160 and the conductor 152 connects the drain of transistors Q0B-Q31B to the negative terminal of the output amplifier 160. Furthermore, the gates of the differential transistors Q0B-Q31B are connected to the output conductor 154 and receive the voltage VOUT generated by the output of the output amplifier 160.

The string DAC 102 of FIG. 2 includes an upper terminal of each resistor R1-R128 that is connected by a respective upper switch S1A-S128A to a first conductor 118 and a lower terminal of each resistor R1-R128 that is connected by a respective lower switch S1B-S128B to a second conductor 116. The upper switch and lower switch connected to each resistor is a switch pair. For example, switch S2A and switch S2B are a switch pair for resistor R2. The switch pairs S1A-S1B through S128A-S128B are controlled by the MSB subword decoder 112. The MSB subword decoder 112 selects a switch pair via a switch selector 114 based on a received digital input 110. The MSB subword decoder 112 selects one switch pair per digital input 110. For example, if the digital input 110 of '0110110' is received by the MSB subword decoder 112, the MSB subword decoder 112 selects the upper switch S55A and the lower switch S55B of the resistor R55. As a result, the first conductor 118 receives a voltage at the top node of the resistor R55 and the second conductor 116 receives a voltage at the bottom node of the resistor R55. The difference between the first conductor 118 and the second conductor 116 is the voltage drop across the resistor R55 and is representative of the resolution of the string DAC 102.

The string DAC 102 within the multistage DAC 200 of FIG. 2 may include one or more unit resistors connected between the supply voltage VDD and the string resistors R1-R128. The unit resistors are used to place the multistage DAC 200 into a gain configuration such that the interpolating circuit 204 functions as an interpolating amplifier. The unit resistors are typically multiples of the total resistance of the string resistors R1-R128. For example, if R1-R128 is each 2 ohms, the total string resistance is 256 ohms. A gain 2 configuration requires unit resistors with a total resistance of 256 ohms, a gain 3 configuration requires unit resistors with a total resistance of 384 ohms, a gain 4 configuration requires unit resistors with a total resistance of 512 ohms, etc. The result reduces the voltage drop across each resistor by the gain factor which reduces the voltage difference between the first conductor 116 and the second conductor 118 and decreases the difference in gate voltages on the differential pairs. The output analog signal is then amplified in the interpolating circuit 204.

In an example, a 12-bit digital input of '0110 1101 0010' (decimal value 1746) is received by the multistage DAC 200. The multistage DAC 200 is designed to output an analog voltage that is 42.6% (1746/4095) of the full scale voltage VDD. If VDD is 5.00V, the analog output generated by the multistage DAC 200 is designed to be 2.1318V. The multistage DAC decodes the digital input by partitioning the digital input such that the 7 MSBs ('0110 110') are allocated to the digital input 110 of the MSB subword decoder 112 and the 5 LSBs ('1 0010') are allocated to the digital input 120 of the LSB subword decoder 120. The MSB subword decoder 112 decodes the digital input into the decimal value of 54 corresponding to switch pair S55A-S55B and uses the switch selector 114 to select the upper switch S55A and the lower switch S55B corresponding to string resistor R55. The first conductor 118 receives a voltage of 2.148V from the higher tap point of the resistor R55 and the second conductor 116 receives a voltage of 2.109 from the lower tap point of the resistor R55. The interpolating DAC 204 interpolates a voltage between the 0.039V difference of the first conductor 118 and the second conductor 116 corresponding to the 5-bit digital input ('1 0010'). The LSB subword decoder 122 decodes the 5-bit digital input 120 into the decimal value of 18 and uses the switch selector 124 to switch switches SW1-SW18 to the first conductor 118 and the switches SW19-SW31 to the second conductor 116. As a result the gates of transistors Q1A-Q18A receive the voltage of 2.148V and the gates of transistors Q0A, Q19A-Q31A receives the voltage of 2.109V. With 18 of the differential pairs switched to the higher voltage and 15 of the differential pairs switched to the lower voltage, the interpolating DAC would have INL error in the analog output voltage if not for the error correction circuits 240-246. The error correction circuits 240-246 modify the current through the transistors in the differential pairs to minimize the INL error resulting from the difference in gate voltages from the differential pairs. The resulting analog voltage on the output conductor 154 from the output amplifier is 2.138. The minimized INL error resulting from the error correction circuits 240-246 is shown in the 'corrected' waveform in FIG. 4.

Figure 5:
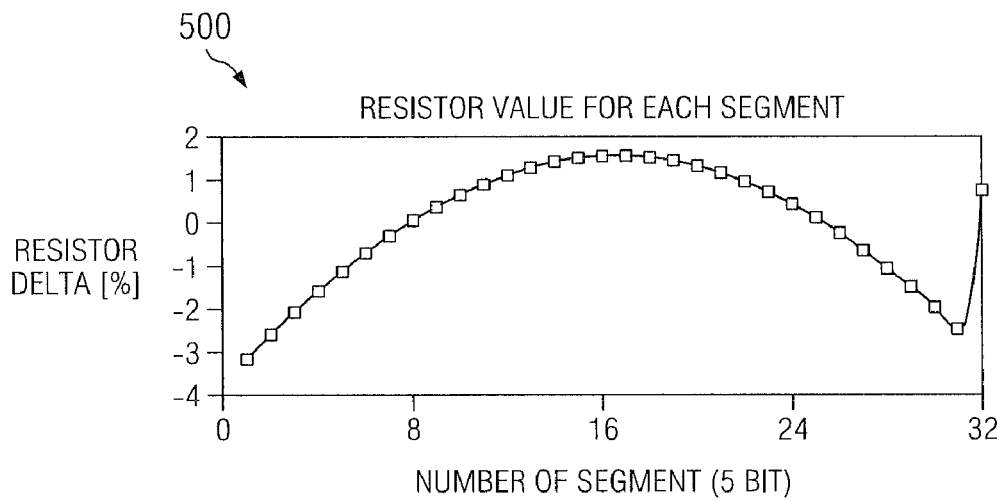
FIG. 5 shows a graph of calculated delta resistor values for each of the degeneration resistors for the differential pairs of FIG. 3A in the interpolating DAC of FIG. 2.

While an example manner of implementing any or all of the example interpolating DAC 204 and/or the example error correction circuits 240-246 are illustrated in FIG. 2, the interpolating DAC 204 and/or the error correction circuits 240-246 may be implemented using any number and/or type(s) of alternative and/or additional logic, devices, components, circuits, etc. Further, the logic, devices, components, circuits, etc. illustrated in FIG. 2 may be split, combined, re-arranged, eliminated and/or implemented in any other way. For example, the PMOS current transistor Q2A may be implemented using a bipolar junction transistor. Additionally, the example interpolating DAC 204 and/or the example error correction circuits 240-246 may include additional logic, devices, components, circuits, etc. than those illustrated in FIG. 2 and/or may include more than one of any or all of the illustrated logic, devices, components, circuits. Although the multistage DAC 200 in FIG. 2 is shown with 7 MSBs and 5 LSBs, the multistage DAC 200 may include any number of MSBs and/or any number of LSBs. Additionally, FIGS. 4 and 5 show data for a 5 bit interpolating DAC 204, however, the data in FIGS. 4 and 5 represent similar characteristics for the interpolating DAC 204 for any number of bits.

Figure 3A:
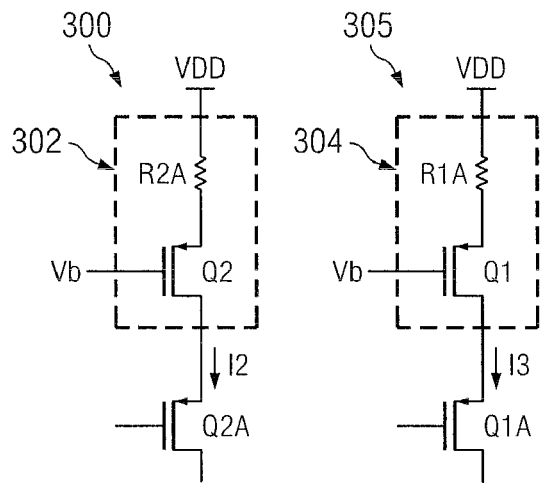
FIGS. 3A-3E show example schematic diagrams of example error correction circuits.

FIGS. 3A-3E show example error correction circuits 240-246 of FIG. 2. FIG. 3A shows an interpolating segment 300 including an error correction circuit 302 providing current for the differential pair transistors Q2A and Q2B (not shown) and an interpolating segment 305 including an error correction circuit 304 providing current for the differential pair transistors Q1A and Q1B (not shown). The error correction circuit 302 includes a current transistor Q2 and a resistor R2A. The current transistor Q2 is a PMOS transistor receiving a gate bias voltage Vb from the reference circuit 230 of FIG. 2. The source of the current transistor Q2 is connected in series to the resistor R2A and the drain of the current transistor Q2 is connected to the source of the differential pair transistor Q2A. Additionally, the drain of the current transistor Q2 is connected to the source of the differential pair transistor Q2B. Furthermore, the resistor R2A is connected to a voltage source VDD.

The current transistor Q2 with the resistor R2A provides a current I2 of 375 nanoamperes (nA) for the differential pair transistor Q2A. The value of 375 nA for current I2 is provided as an example value, in other examples the current I2 may be different values. The resistor R2A functions as the degenerative resistive error correction circuit by modifying the current through the current transistor Q2 to minimize the INL error from the transistor Q2A. In the example of FIG. 3A, the calculated resistance to minimize INL error for the resistor R2A is 97.5 kohm, which is equal to the 100 kohm of the resistor Rref of FIG. 2 plus a calculated delta resistance value of −2.5%. A description of the calculation of the delta resistance value is described below in connection with FIG. 5.

Likewise, the error correction circuit 304 of FIG. 3A includes a current transistor Q1 and a resistor R1A. The current transistor is a PMOS transistor receiving a gate bias voltage Vb from the reference circuit 230. The source of the current transistor Q1 is connected to the resistor R1A and the drain of the current transistor Q1 is connected to source of differential pair transistor Q1A. Additionally, the drain of the current transistor is connected to the source of the differential pair transistor Q1B. The current transistor Q1 provides a current I3 of 370 nA for the differential pair transistor Q1A. In the example of FIG. 3A, the calculated resistance of the resistor R1A is 98.5 kohm which is equal to the 100 kohm of the resistor Rref plus a calculated delta resistance value of −1.5% to minimize the INL error from the differential pair transistor Q1A. A description of the calculation of the delta resistance value is described below in connection with FIG. 5. Because the INL error from transistor Q2A differs from the INL error from the transistor Q1A the currents I2 and I3 from the respective error correction circuits 302 and 304 are different. On average, the voltage drop across the resistors R2A and R1A is 50 mV. Furthermore, the addition of the resistor R2A and/or R1A does not decrease noise performance or current consumption of the interpolation DAC 204.

Figure 3B:
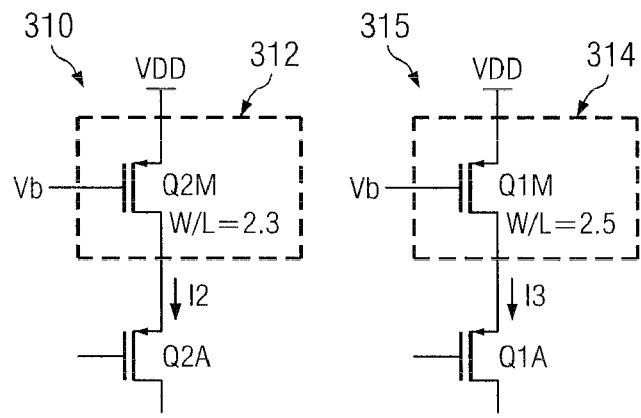

FIG. 3B shows an interpolating segment 310 including an error correction circuit 312 providing current for the differential pair transistors Q2A and Q2B (not shown) of FIG. 2 and an interpolating segment 315 including an error correction circuit 314 providing current for the differential pair transistors Q1A and Q1B (not shown). The current transistor Q2M and Q1M are PMOS transistors receiving a gate bias voltage Vb from the reference circuit 230 of FIG. 2. The sources of the current transistors Q2M and Q1M are connected to a voltage source VDD and their drains are connected to respective differential pairs of transistors Q2A and Q1A. The error correction circuit 302 includes a current transistor Q2M with modified physical dimensions. The current transistor Q2M has a gate to length (W/L) ratio of 2.3. Likewise, the error correction circuit 314 includes a current transistor Q1M with modified physical dimensions of a W/L ratio of 2.5. Modifying the W/L ratio of the current transistors Q2M and Q1M changes their operating characteristics resulting in a change in current such that the current to the differential pairs Q2A and Q1A is modified to minimize INL errors. Modifying the W/L gate dimensions of current transistors may increase or decrease the current generated by the current transistor when the gate bias voltage Vb is held constant. For example, modifying the W/L gate dimensions of current transistor Q2M changes the current from the I1 shown in the interpolating DAC 104 in FIG. 1 to I2. In the same manner as FIG. 3A, the dimensions of the current transistors Q2M and Q1M are calculated by determining the INL error without the current correction circuit for each interpolating segment 310 and 315, converting the INL error to a delta value and multiplying the delta value calculated for each interpolating segment 310 and 315 by the W/L ratio of the PMOS transistor in the reference circuit 230.

Figure 3C:
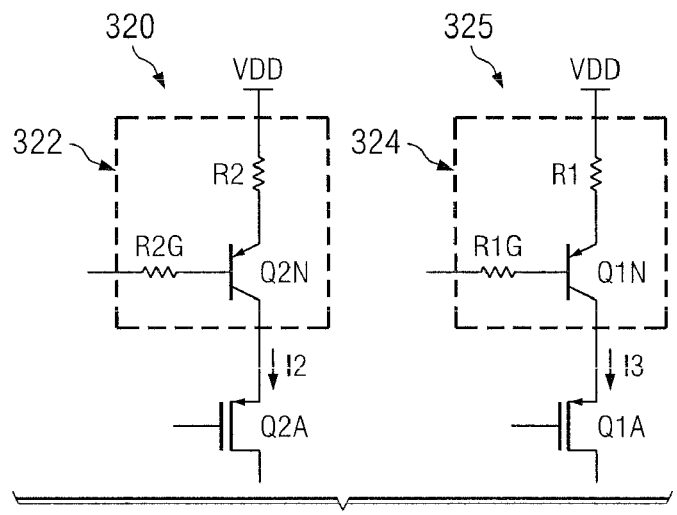

FIG. 3C shows an interpolating segment 320 including an error correction circuit 322 providing current for the differential pair transistors Q2A and Q2B (not shown) and an interpolating segment 325 including an error correction circuit 324 providing current for the differential pair transistors Q1A and Q1B (not shown). The error correction circuit 322 includes a current transistor Q2N, a resistor R2, a resistor R2G, and the differential pair transistor Q2A. The resistor R2 is connected in series between the voltage source VDD and the source of current transistor Q2N. Likewise, the error correction circuit 324 includes a current transistor Q1N, a resistor R1, a resistor R1G, and the differential pair transistor Q1A. The resistors R2 and R1 are connected in series between the voltage source VDD and the source of the respective current transistor Q2N and Q1N. Additionally, in FIG. 3C transistors Q1N and Q2N are bipolar junction transistors (BJTs). The resistors R2 and R1 and the current transistors Q2N and Q1N form a current mirror with the reference circuit 230 of FIG. 2. The value of the resistors R2 and R1 are equal to the resistance of the resistor Rref. The error correction circuits 322 and 324 include the respective resistors R2G and R1G to modify the bias gate voltage Vb from the reference circuit 230 to the respective current transistors Q2N and Q1N to minimize INL error. The current flowing into the base of the BJT transistors Q1N and Q2N provides a basis for the voltage drop across respective resistors R1G and R2G. The resistance of the resistor R2G is determined such that the voltage drop across the resistor R2G causes a change in the current generated by the current transistor Q2N (i.e., from I1 to I2). For example, a drop of a couple of mVs across the resistor R2G lowers the current generated by the transistor Q2N to compensate for the INL error from the higher gate voltage from the first conductor 118 connected to the differential pair transistor Q2A. Likewise, the resistance of the resistor R1G is determined such that the voltage drop across the resistor R2G causes a change in the current generated by the current transistor Q1N (i.e., from I1 to I3).

Figure 3D:
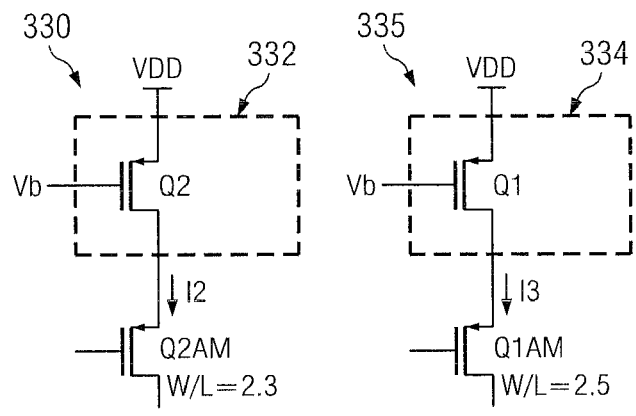

FIG. 3D shows an interpolating segment 330 including an error correction circuit 332 providing current for the differential pair transistors Q2AM and Q2BM (not shown) and an interpolating segment 335 including an error correction circuit 334 providing current for the differential pair transistors Q1AM and Q1BM (not shown). The current transistor Q2 and Q1 are PMOS transistors receiving a gate bias voltage Vb from the reference circuit 230 of FIG. 2. The sources of the current transistors Q2 and Q1 are connected to a voltage source VDD and their drains are connected to respective differential pairs of transistors Q2AM and Q1AM. In FIG. 3D the differential pair transistor Q2AM has a gate W/L ratio of 2.3. Likewise, the differential pair transistor Q1AM has a gate W/L ratio of 2.5. Modifying the W/L ratio of the differential pair transistors Q2AM and Q1AM changes their operating characteristics resulting in a change in drain current when the transistor is activated by a voltage on its gate from the first conductor 118 or the second conductor 116 of FIG. 2. The calculated change in drain current compensates for the voltage differences on the gates of the differential transistors resulting in a minimization of the INL error.

Figure 3E:
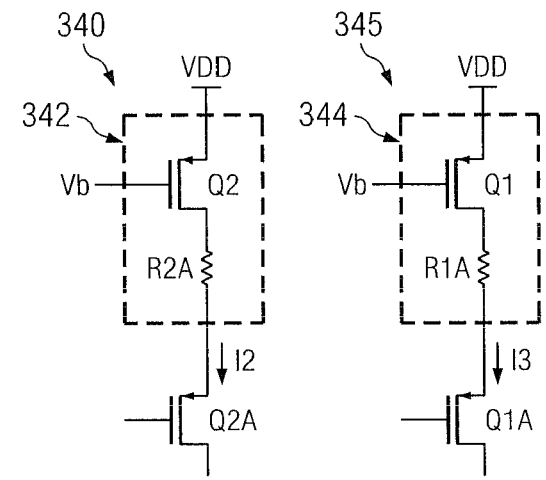

FIG. 3E shows an interpolating segment 340 including an error correction circuit 342 providing current for the differential pair transistors Q2A and Q2B (not shown) and an interpolating segment 345 including an error correction circuit 344 providing current for the differential pair transistors Q1A and Q1B (not shown). The error correction circuit 342 includes a current transistor Q2 and a resistor R2A. The current transistor Q2 is a PMOS transistor receiving a gate bias voltage Vb from the reference circuit 230 of FIG. 2. The source of the current transistor Q2 is a voltage source and the drain of the current transistor Q2 is connected to the resistor R2A. Additionally, the resistor R2A is connected in series to the source of differential pair transistor Q2A. Likewise, error correction circuit 344 includes a current transistor Q1 and a resistor R1A. The current transistor Q2 is a PMOS transistor receiving a gate bias voltage Vb from the reference circuit 230 of FIG. 2. The source of the current transistor Q2 is a voltage source and the drain of the current transistor Q2 is connected to the resistor R1A. Additionally, the resistor R1A is connected in series to the source of differential pair transistor Q1A. The resistors R2A and R1A function as degeneration resistors modifying the current to the respective differential pair transistors Q2A and Q1A in the same manner as the resistors R2A and R1A in FIG. 3A. FIG. 3D shows the flexible placement of the resistors R2A and R1A in series between the voltage source VDD and the respective differential pair transistors Q2A and Q1A to minimize INL errors.

While an example manner of implementing any or all of the example error correction circuits 302, 304, 312, 314, 322, 324, 332, 334, 342, and/or 344 are illustrated in FIGS. 3A-3E, error correction circuits 302, 304, 312, 314, 322, 324, 332, 334, 342, and/or 344 may be implemented using any number and/or type(s) of alternative and/or additional logic, devices, components, circuits, etc. Further, the logic, devices, components, circuits, etc. illustrated in FIGS. 3A-3E may be split, combined, re-arranged, eliminated and/or implemented in any other way. For example, the PMOS current transistor Q2 may be implemented using a bipolar junction transistor. Additionally, the example error correction circuits 302, 304, 312, 314, 322, 324, 332, 334, 342, and/or 344 may include additional logic, devices, components, circuits, etc. than those illustrated in FIGS. 3A-3E and/or may include more than one of any or all of the illustrated logic, devices, components, circuits.

FIG. 4 illustrates example output waveforms 400 of the INL error calculated from the multistage DAC 100 of FIG. 1 and the example multistage DAC 200 including the error correction circuits 240-246 of FIG. 2. The INL calculated from the multistage DAC 100 is represented by the 'uncorrected' waveform 402 and the INL calculated from the example multistage DAC 200 is represented by the 'corrected' waveform 404. The waveforms 400 show INL error in terms of voltage (uV) for the multistage DACs 100 and 200. The x-axis represents the number of interpolating segments in each multistage DAC 100 and 200 connected to the first conductor 118. For example, the INL error at the value of 8 on the x-axis represents the INL error measured in the output analog voltage of the multistage DACs 100 and 200 when 8 interpolating segments (e.g., the gates of the differential pair of transistors) are connected to the first conductor 118 and 24 interpolating segments are connected to the second conductor 116. Because the interpolating segments are switched to the first conductor 118 according to numerical value based on the digital input, the INL error at each point on the x-axis is the INL error contributed by changing the gate voltage on that interpolating segment subtracted from the INL error at the previous point on the x-axis. Thus, for example, the INL error at value 8 on the x-axis for waveform 402 is the INL error generated by the interpolating segment 8 (i.e., Q8A-Q8B) subtracted from the INL error generated by the interpolating segment 7 (i.e., −59 uV−(−50 uV)=−9 uV).

The INL error is a measure of how much the output signal generated by the multistage DACs 100 and 200 differs from theoretical operation. Due to the monotonic nature of the siring DAC 102 and the interpolating DACs 104 and 204, the analog output should be a linear representation of the digital input. In other words, for every bit increase in the digital signal the analog voltage should increase by the same voltage. The deviation from this theoretical linear voltage yields an output analog signal that is sometimes greater in magnitude then the theoretical value or less then the theoretical value. For example, in a theoretical multistage DAC a digital input of '0000 1001 0000' should result in an analog voltage of 175.8 mV. If there is INL error in the output signal, the analog output signal may only be 175.2 mV.

The INL error shown in the waveform 402 results from the slightly different current draws between the gates of some differential pairs connected to the first conductor 118 and the gates of the other differential pairs connected to the second conductor 116. In the case of 0 on the x-axis, all of the differential pairs are connected to the second conductor 116 with no difference in gate voltages between the differential pairs. Likewise, there is almost no INL error when all 32 differential pairs are connected to the first conductor (i.e., point 32). At point 16, the number of interpolating segments with differential pairs connected to the first conductor 118 is the same number as the number of interpolating segments with differential pairs connected to the second conductor 116 resulting in a canceling of the INL error from the differential pairs and a net result of no INL error in the analog output signal. The greatest INL error occurs at the points where ¾ of differential pairs are connector to either the second conductor 116 or the first conductor 118. This is the point where there are enough interpolating segments with differential pairs connected to one conductor to generate significant INL error, but not enough to have the INL error canceled out by the interpolating segments with differential pairs connected to the other conductor.

The waveforms 400 show that the error correction circuits 240-246 minimize the INL error for every number of differential pairs connected to the first conductor 118 compared to the multistage DAC 100 without current correction components. The INL error in the waveform 404 can further be reduced by circuitry implementing an offset shift of −10 uV in the multistage DAC 200 analog output. The waveforms 400 show an INL error improvement of 90% in the INL error resulting in improved performance and resolution of the multistage DAC 200 compared to the multistage DAC 100. In cases where there are fewer bits in the string DAC resulting in larger INL error, the magnitude of the improvement further increases.

FIG. 5 shows an example graph 500 of calculated resistor delta values for each of the error correction circuit resistors (e.g., R1A and R2A of FIGS. 3A and 3E) for the differential pairs in the interpolating DAC of FIG. 2. The values are calculated using a mathematical formula (2) and the INL error on the 'uncorrected' waveform 402 in FIG. 4. The mathematical formula (2) is:

$$R[i]=R_{ref}+\Delta R=R_{ref}+C_{corr}\cdot(Verror[i]-Verror[i-1]) \quad (2)$$

The mathematical formula (2) was derived from an experimental process of starting with an interpolating DAC without current correction circuits and finding the optimal resistance for minimizing the INL error of a resistor in series with the power source VDD and a current transistor for one interpolating segment of a differential pair. Once the resistance was determined, the process was repeated for the next differential pair in the interpolating DAC and so forth until each differential pair in the interpolating DAC included a modified resistor. The result was a reduction in INL error in the analog output for all differential pairs.

In the example mathematical formula (2), R[i] is the resistance value of the error correction circuit resistor (e.g., R2A) in series with the current transistor, $R_{ref}$ is the resistance of the resistor Rref in the reference circuit of FIG. 2, $\Delta R$ is the delta change is resistance to minimize INL error, Verror[i] is the INL error associated with the differential pair [i] in series with the resistor R[r], Verror[i−1] is the INL error associated with the adjacent differential pair [i−1], and $C_{corr}$ is the correlation constant to convert the INL error into a resistance. The mathematical formula (2) shows that the delta change in resistance to minimize INL error is proportional to the difference in INL error from the adjacent differential pair. In other words, the delta modifying value is equal to the derivative of the INL error for each differential pair. The delta value is added to the value of the corresponding component in the reference circuit 230 to get the final modifying value for the error correction circuit. For example, the calculated $\Delta R$ for each differential pair is added to the value of the resistance of the resistor Rref to determine the resistance value of the degeneration resistor in the error correction circuit.

The correlation constant $C_{corr}$ is calculated for each multistage DAC and is dependent upon the number of differential pairs, the number of string resistors, the process technology used to fabricate the multi stage DAC, and the design scheme to implement the multistage DAC. Additionally, a correlation constant can be calculated for each type of modifying component and/or modifying dimension. For example, a W/L ratio for a current transistor can be calculated from the correlation constant.

The graph 500 shows the resistor delta value for each interpolating segment in the interpolating DAC 200, with the interpolating segment identified by numerical value. For example, the value of 1 on the x-axis corresponds to interpolating segment 0 and the Q0A-Q0B differential pair of transistors. The resistor delta value is expressed as a percent deviation from the resistor Rref of the reference circuit 230 of FIG. 2. For example, a resistor delta value of −2% is a resistor with a value equal to 98% of the resistance of the resistor Rref.

The delta value is proportional to the magnitude of the slope of the INL error in the waveform 402. For example, the slope of the INL error at interpolating segments 8 and 24 in waveform 402 is close to 0. Likewise, the resistor delta value in the graph 500 at point 8 and 24 is close to 0%. The graph 500 shows error correction circuit resistors at interpolating segments 1-7 and 25-31 with lower resistance values compared to the resistor Rref and resistors at interpolating segments 8-24 with higher resistance values compared to the resistor Rref to minimize INL error in the output analog signal. The resistor delta values for each differential pair are implemented in the interpolating DAC 200 to produce the INL error waveform 404 shown in FIG. 4.

Figure 6:
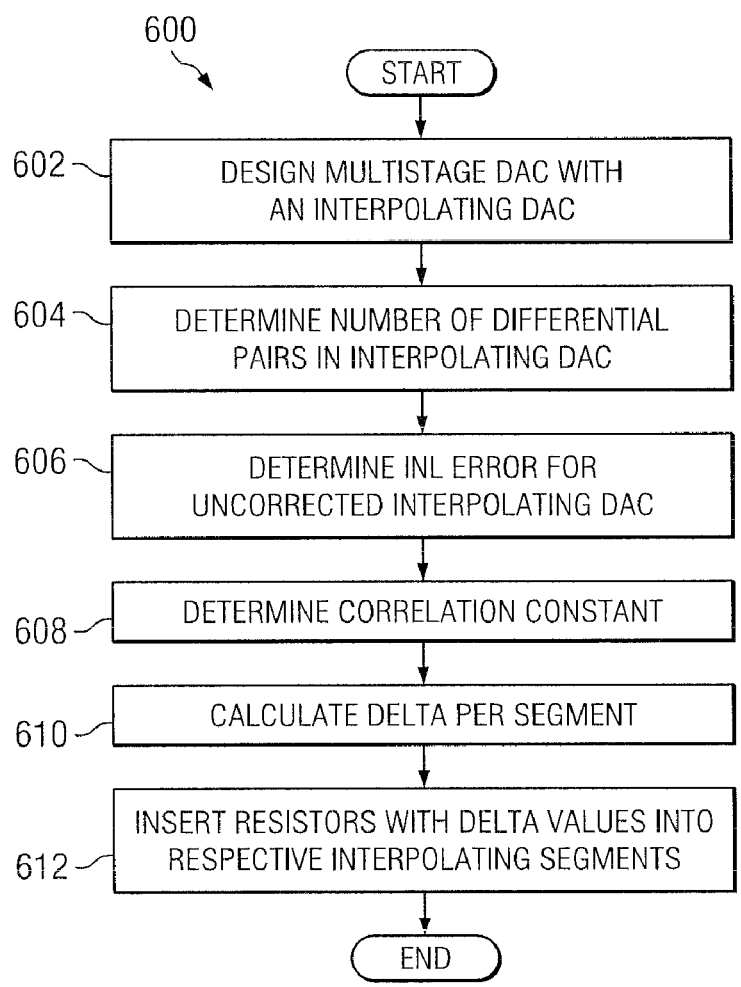
FIG. 6 shows a flowchart of an example manner of designing the example nonlinearity error current correction circuit of FIG. 2.

FIG. 6 is a flowchart representative of an example process machine that may be executed to minimize nonlinearity errors in an interpolating circuit. The example process may be implemented using machine readable instructions that may be executed using, for example, a processor system. However, one or more of the blocks depicted in the flowcharts may be implemented in any other manner, including by dedicated purpose circuitry, manual operations, etc. Additionally, although the example instructions are described with reference to the flowchart of FIG. 6 other methods minimize nonlinearity errors in an interpolating circuit may additionally or alternatively be used. For example, the order of execution of the blocks depicted in the flowcharts of FIG. 6 may be changed, and/or some of the blocks described may be rearranged, eliminated, or combined.

The example instructions 600 represented by FIG. 6 may be performed to implement the example interpolating DAC 204 of FIG. 2 and/or the example error correction circuits 302, 304, 312, 314, 322, 324, 332, 334, 342, and/or 344 of FIGS. 3A-3E. The example instructions 600 may be executed at predetermined intervals, based on an occurrence of a predetermined event, in response to a user request, etc., or on any combination thereof. For example, the instructions 600 may be executed at predetermined intervals, such as hourly, daily, etc. Additionally or alternatively, the example instructions 600 may be executed upon the occurrence of a trigger generated remotely such as, for example, an instruction to design a multistage DAC including an interpolating DAC.

The example instructions 600 of FIG. 6 begin when a multistage DAC including at least one interpolating DAC design is initiated (block 602). The design may be within a schematic capture program such as, for example, P-Spice Schematic Capture by Cadence™. The interpolating DAC initially is not designed with the INL error correction circuitry. Next, the differential pairs of transistors are designed into the interpolating DAC based on the number of LSBs decoded by the interpolating DAC (block 604). Then, the interpolating DAC is simulated and the INL error for the interpolating DAC is determined (block 606). Once the INL error for the uncorrected interpolating DAC is determined, a correlation constant for the error correction circuit equation is determined based on the type of unit conversion for the delta value, the number of differential pairs in the interpolating DAC, the number of string resistors in the string DAC, the process technology, and the layout topology (block 608). The type of unit conversion is based on the type of error correction circuit. For example, the correlation constant may correspond to an error correction circuit including degenerative resistors, current transistor dimensions, and/or differential pair transistor dimensions. Next, the calculated correlation constant is used in the error correction circuit mathematical formula to calculate the delta value per interpolating segment in the interpolating DAC (block 610). Then, the calculated delta values are designed into the error correction circuit within the interpolating DAC (block 612). The instructions 600 end when the error correction circuit within the interpolating DAC minimizes INL error in the analog output.

Although certain example methods, apparatus and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. An interpolation circuit comprising:
   a first voltage-current converter circuit including a first transistor and a second transistor that each have an electrode that is configured to receive an input signal;
   a second voltage-current converter circuit including a third transistor and a fourth transistor that each have an electrode configured to receive the input signal;
   a reference circuit;
   a first error correction circuit that is coupled to the reference circuit and to the first voltage-current converter, wherein the first error correction circuit has a first impedance that sets a first current to operate the first voltage-converter circuit in a nominal linear operating mode so as to reduce a first integral nonlinearity error; and
   a second error correction circuit that is coupled to the reference circuit and to the second voltage-current converter, wherein the second error correction circuit has a second impedance that sets a second current to operate the second voltage-converter circuit in the nominal linear operating mode so as to reduce a second integral nonlinearity error.

2. The interpolation circuit of claim 1, wherein the first impedance further comprises a first resistor with a resistance value equal to a sum of a reference resistor and a first variance and the second impedance further comprises a second resistor with a resistance value equal to a sum of the reference resistor and a second variance.

3. The interpolation circuit of claim 2, wherein the first variance is a calculated value such that the first current through the first resistor and the first current source reduces the first integral nonlinearity error and the second variance is a calculated value such that the second current through the second resistor and the second current source reduces the second integral nonlinearity error.

4. The interpolation circuit of claim 2, wherein the first variance is calculated by multiplying the first integral nonlinearity error by a correlation constant and the second variance is calculated by subtracting the second integral nonlinearity error from the first integral nonlinearity error and multiplying a difference by the correlation constant.

5. The interpolation circuit of claim 4, wherein the correlation constant is a value determined from at least one of voltage-converter circuits and a process technology used to fabricate the interpolation circuit.

6. The interpolation circuit of claim 2, wherein the first variance is calculated by at least one of a first magnitude and a first slope of the first integral nonlinearity error in the first voltage-current converter circuit and the second variance is calculated by at least one of a second magnitude and a second slope of the second integral nonlinearity error in the second voltage-current converter circuit.

7. The interpolation circuit of claim 6, wherein the first slope and the second slope includes at least one of a positive value and a negative value.

8. The interpolation circuit of claim 2, wherein the first correction circuit further comprises a first current transistor with a first electrode, a second electrode coupled to the reference circuit, and a third electrode, and wherein the correction circuit further comprises a second current transistor with a first electrode, a second electrode coupled to the reference circuit, and a third electrode.

9. The interpolation circuit of claim 8, wherein the first resistor is coupled between the first electrode of the first current transistor and a voltage source, and wherein the second resistor is coupled between the first electrode of the second current transistor and the voltage source.

10. The interpolation circuit of claim 1, wherein the first error correction circuit further comprises a first current transistor with one or more physical dimensions configured to reduce the first integral nonlinearity error, and wherein the second error correction circuit further comprises a second current transistor with one or more physical dimensions configured to reduce the second integral nonlinearity error.

11. The interpolation circuit of claim 10, wherein the first current transistor physical dimensions and the second current transistor physical dimensions include at least one of a gate width, a gate length, and an aspect ratio.

12. The interpolation circuit of claim 11, wherein the ratio of the gate width to the gate length is calculated as a sum of the ratio of the gate width to the gate length of a transistor within the current reference circuit plus a ratio variance.

13. The interpolation circuit of claim 12, wherein a first ratio variance is calculated by multiplying the first integral nonlinearity error associated with the first current source by a ratio correlation constant and a second ratio variance is calculated by subtracting the second integral nonlinearity error associated with the second current source from the first integral nonlinearity error associated with the first current source and multiplying a difference by the ratio correlation constant.

14. The interpolation circuit of claim 1, wherein the nominal linear operating mode is the point where:
   the first current is linearly proportional to a voltage applied to a second electrode of the first transistor within the first voltage-converter circuit and is linearly proportional to a voltage on a second electrode of the second transistor within the first voltage-converter circuit; and
   the second current through the second voltage-current converter circuit is linearly proportional to a voltage applied to a second electrode of the first transistor within the second voltage-converter circuit and linearly proportional to a voltage on a second electrode of the second transistor within the second voltage-converter circuit.

15. An interpolation circuit for digitally interpolating between a first voltage on a first conductor and a second voltage on a second conductor comprising:
   a first and a second differential pair, each differential pair including a first transistor and a second transistor, each of the first transistor and the second transistor having a first electrode configured to receive a signal generated by a corresponding current source transistor;
   a first current source transistor providing a first current to the first voltage-converter circuit and including a first resistor with a calculated first resistance value to reduce a first integral nonlinearity error in the interpolation circuit by setting the first current through the first current source transistor to operate the first differential pair in a nominal linear operating mode; and
   a second current source transistor providing a second current to the differential pair and including a second resistor and a calculated second resistance value to reduce a second integral nonlinearity error in the interpolation circuit by setting the second current through the second current source transistor to operate the second differential pair in a nominal linear operating mode.

16. An apparatus comprising:
   an input stage having a first output terminal and a second output terminal; and
   an interpolation circuit having:
      a first differential pair, wherein the control electrode of at least one of the transistors from the first differential pair is coupled to one of the first and second output terminals of the input stage;

a second differential pair, wherein the control electrode of at least one of the transistors from the first differential pair is coupled to the input stage;

a reference circuit;

a first correction circuit that is coupled to the first differential pair, wherein the first correction circuit includes:

a first resistor with a first resistance that is the sum of a reference resistance and a first variance, wherein the first variance is based at least in part on a first integral nonlinearity error; and a first transistor having a first electrode, a second electrode, and a third electrode, wherein the first resistor is coupled to one of the first, second, and third electrodes of the first transistor;

a second correction circuit that is coupled to the first differential pair, wherein the first correction circuit includes:

a second resistor with a second resistance that is the sum of the reference resistance and a second variance, wherein the second variance is based at least in part on a second integral nonlinearity error; and a second transistor having a first electrode, a second electrode, and a third electrode, wherein the second resistor is coupled to one of the first, second, and third electrodes of the second transistor.

17. The apparatus of claim 16, wherein the reference circuit further comprises:

a reference resistor having the reference resistance; and a diode-connected transistor that is coupled to the reference resistor.

18. The apparatus of claim 17, wherein the second variance is the difference between the first and second integral nonlinearity errors multiplied by a correlation constant.

19. The apparatus of claim 18, wherein the interpolation circuit further comprises:

an output amplifier having a first input terminal, a second input terminal, and an output terminal, wherein the first input terminal and second input terminals are each coupled to each of the first and second differential pairs;

a current mirror that is coupled to each of the first and second differential pairs.

20. The apparatus of claim 19, wherein the interpolation circuit further comprises:

a switch network that is coupled to the input stage; and a decoder that controls the switch network.

21. The apparatus of claim 20, wherein the decoder further comprises a first decoder, and wherein the input stage further comprises:

a resistor string having a plurality of resistors coupled in series with one another;

a first set of switches, wherein each switch from the first set of switches is coupled between at least one of the resistors from the resistor string and the first output terminal;

a second set of switches, wherein each switch from the second set of switches is coupled between at least one of the resistors from the resistor string and the second output terminal; and a second decoder that controls the first and second set of switches.

22. An apparatus comprising:

an input stage having a first output terminal and a second output terminal; and an interpolation circuit having:

a first differential pair, wherein the control electrode of at least one of the transistors from the first differential pair is coupled to one of the first and second output terminals of the input stage;

a second differential pair, wherein the control electrode of at least one of the transistors from the first differential pair is coupled to the input stage;

a reference circuit;

a first correction circuit that is coupled to the first differential pair, wherein the first correction circuit includes a first transistor, wherein the aspect ratio of the first transistor is selected based at least in part on a first integral nonlinearity error;

a second correction circuit that is coupled to the first differential pair, wherein the first correction circuit includes a second transistor, wherein the aspect ratio of the second transistor is selected based at least in part on a second integral nonlinearity error.

23. The apparatus of claim 22, wherein the reference circuit further comprises:

a reference resistor having the reference resistance; and a diode-connected transistor that is coupled to the reference resistor.

24. The apparatus of claim 23, wherein the interpolation circuit further comprises:

an output amplifier having a first input terminal, a second input terminal, and an output terminal, wherein the first input terminal and second input terminals are each coupled to each of the first and second differential pairs;

a current mirror that is coupled to each of the first and second differential pairs.

25. The apparatus of claim 24, wherein the interpolation circuit further comprises:

a switch network that is coupled to the input stage; and a decoder that controls the switch network.

26. The apparatus of claim 25, wherein the decoder further comprises a first decoder, and wherein the input stage further comprises:

a resistor string having a plurality of resistors coupled in series with one another;

a first set of switches, wherein each switch from the first set of switches is coupled between at least one of the resistors from the resistor string and the first output terminal;

a second set of switches, wherein each switch from the second set of switches is coupled between at least one of the resistors from the resistor string and the second output terminal; and a second decoder that controls the first and second set of switches.

* * * * *